United States Patent
Larsson

Patent Number: 6,072,344
Date of Patent: Jun. 6, 2000

[54] PHASE-LOCKED LOOP (PLL) CIRCUIT CONTAINING A PHASE DETECTOR FOR ACHIEVING BYTE ALIGNMENT

[75] Inventor: Patrik Larsson, Matawan, N.J.

[73] Assignee: Lucent Technologies Inc., Murray Hill, N.J.

[21] Appl. No.: 09/015,014

[22] Filed: Jan. 28, 1998

[51] Int. Cl.[7] .......................................................... H04L 7/04
[52] U.S. Cl. .............................. 327/156; 327/9; 327/159; 375/376
[58] Field of Search .................................... 327/3, 7, 8, 9, 327/12, 24, 147, 150, 156, 159, 162; 375/375, 376, 365, 366

[56] References Cited

U.S. PATENT DOCUMENTS 5,367,542  11/1994  Guo ......................................... 375/110
5,739,762   4/1998  Kuramatsu et al. ................ 340/825.21

Primary Examiner—Tuan T. Lam

[57] ABSTRACT

A parallel sampling receiver is disclosed that utilizes a sampled binary phase detector (SBPD) to achieve byte alignment. A parallel sampling receiver utilizes five parallel sampled phase detectors to sample incoming data and an additional edge-detecting sampled binary phase detector (SBPD) operating as a phase detector for sampling the incoming data signal between two data bits, such as data bits $D_4$ and $D_5$. The sampled binary phase detector (SBPD) should be either high or low if there is a binary transition from high to low between data bits $D_4$ and $D_5$, indicating whether the sampling is being done just before or just after the falling edge, respectively. Byte alignment is provided by the parallel sampling receiver. The edge-detecting sampled binary phase detector (SBPD) will automatically perform byte alignment if a preamble in the frame header consists, for example, of consecutive 11001 bytes (in an illustrative 5 bit implementation) and the edge-detecting sampled binary phase detector (SBPD) is made to lock onto a positive edge. The predefined preamble sequence should contain only one positive edge, positioned at the location of the edge-detecting sampled binary phase detector (SBPD).

42 Claims, 3 Drawing Sheets

PHASE-LOCKED LOOP (PLL) CIRCUIT CONTAINING A PHASE DETECTOR FOR ACHIEVING BYTE ALIGNMENT

CROSS-REFERENCE TO RELATED APPLICATIONS

The present invention is related to the following U.S. patent applications filed contemporaneously herewith: U.S. patent application Ser. No. 09/014,861, entitled "A Phase-Locked Loop (PLL) Circuit Containing a Sampled Phase Detector With Reduced Jitter,"; U.S. patent application Ser. No. 09/014,418, entitled "A Phase-Locked Loop (PLL) Circuit Containing a Sampled Phase Detector With Improved Frequency Acquisition," and U.S. patent application Ser. No. 09/015,035, entitled "A Phase-Locked Loop (PLL) Circuit Containing a Sampled Phase Detector With Improved Frequency Acquisition," each assigned to the assignee of the present invention and incorporated by reference herein.

FIELD OF THE INVENTION

The present invention relates to phase-locked loop (PLL) circuits, and more particularly, to receivers containing a phase detector to achieve bit and byte alignment.

BACKGROUND OF THE INVENTION

Phase-locked loop (PLL) circuits are frequently utilized to lock an oscillator in phase with a reference signal. PLL circuits are often utilized within receivers in digital communication systems to generate a local clock signal that is phase aligned with an incoming reference signal. The phase aligned local clock signal facilitates the receipt and processing of synchronous data sent by a transmitter in the communication system.

A conventional PLL circuit includes a phase detector, a filter and a voltage-controlled oscillator (VCO). In the conventional PLL circuit, the phase detector compares the incoming reference signal and the output of the VCO. The phase detector generates an error signal that is representative of the phase difference of the reference signal and the VCO output The error signal is filtered and applied to the control input of the VCO to produce an output signal that tracks the phase of the reference signal.

Recently, a number of receiver architectures have become popular in digital communication systems. Many receivers recover the clock from the incoming data sequence, using a PLL circuit. One or more data samplers typically sample the incoming data and an edge detector samples the incoming data signal between two adjacent bits, to identify data edges and thereby provide bit synchronization. In addition to performing bit synchronization, the receivers must also perform byte and frame alignment to extract data correctly.

Byte and frame alignment is typically implemented using error detecting codes or frame header detection. An error detecting code implementation typically encodes bytes, and then if frequent errors are detected at the receiver, assumes the data has been received properly, but that the data is not properly aligned. In a frame header detection implementation, the incoming data stream is monitored until a frame header is identified, thereby indicating byte placement. The error detector and frame header detector can be significantly simplified if bytes are already aligned at their input.

SUMMARY OF THE INVENTION

Generally, a receiver is disclosed that utilizes a phase detector to achieve byte alignment. The phase detector is embodied as one or more data samplers to sample incoming data and an edge detector to sample the incoming data signal between two adjacent data bits, such as data bits $D_4$ and $D_5$. The edge detector will be high or low if there is a binary transition from high to low between data bits $D_4$ and $D_5$, indicating whether the sampling is being done just before or just after the falling edge, respectively. Likewise, the edge detector will be low or high if there is a binary transition from low to high between data bits $D_4$ and $D_5$, indicating whether the sampling is being done just before or just after the rising edge, respectively.

According to one aspect of the invention, byte alignment is provided by the phase detector of the receiver. By using a properly selected preamble sequence, the phase detector can accomplish both bit and byte synchronization. A preamble sequence consists of bytes, each containing only one positive edge. When the phase detector receives the predefined preamble sequence, and locks the PLL to the preamble, the phase detector will automatically perform byte alignment. In one illustrative implementation, the phase detector will automatically perform byte alignment, for example, if a preamble in the frame header consists of consecutive 11001 bytes (in an illustrative 5 bit implementation) and the phase detector locks onto a positive edge.

DETAILED DESCRIPTION

Figure 1:
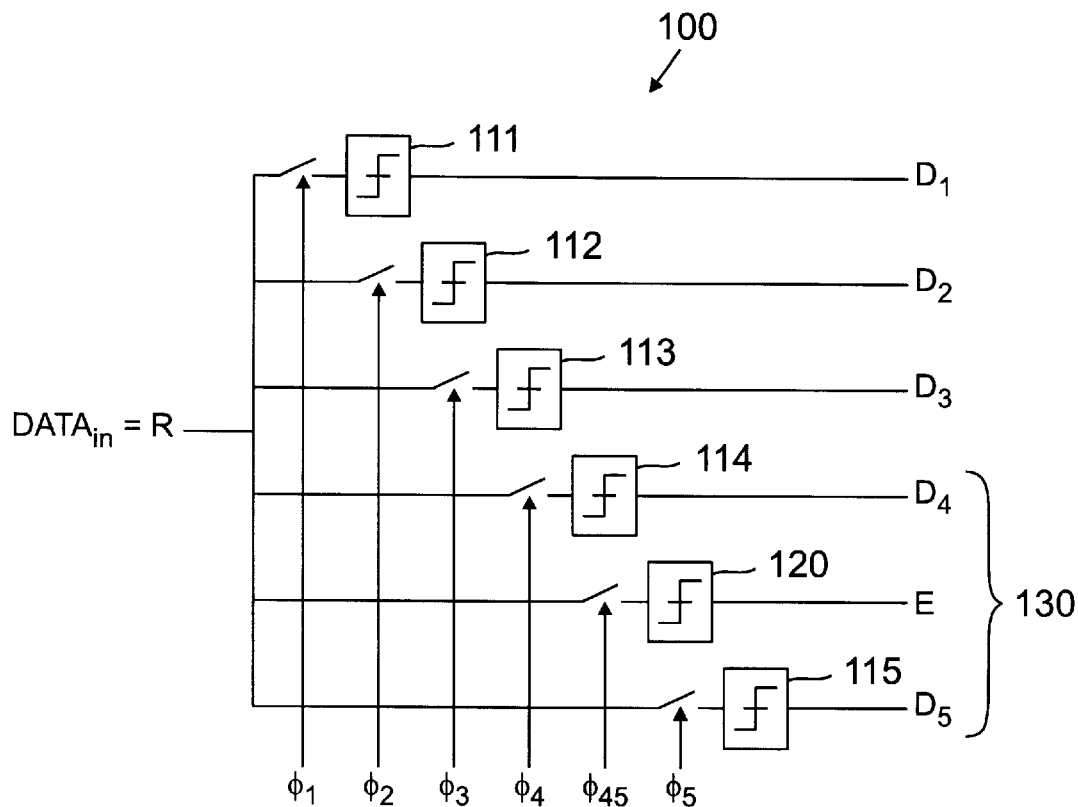
FIG. 1 is illustrating a conventional parallel sampling receiver containing an edge detector, in cooperation with a pair of data samplers, operating as a phase detector.
Figure 2:
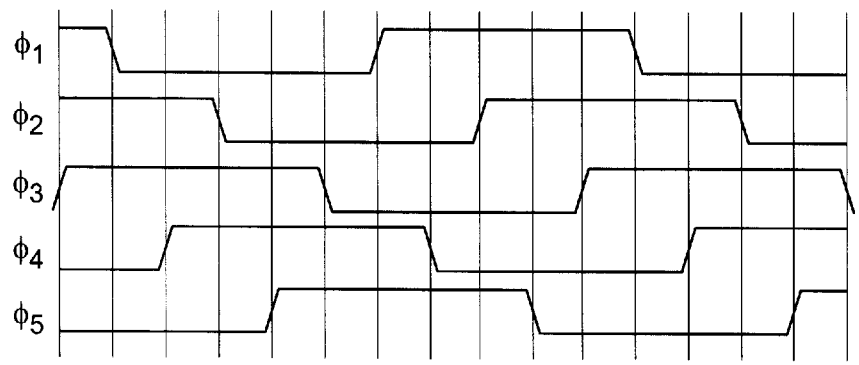
FIG. 2 illustrates the various clock cycles utilized to trigger each of the sampled phase detectors of FIG. 1.

FIG. 1 illustrates a conventional parallel sampling receiver 100 utilizing five parallel data samplers 111–115 for sampling incoming data, $D_1$ through $D_5$. As shown in FIG. 2, the clock phases, $\phi_1$–$\phi_5$, used to trigger the data samplers 111–115, respectively, from the VCO output, $V_O$, are skewed by an amount equal to one-fifth of a clock cycle or period, and their rate is one-fifth of the rate of the incoming data. An edge detector 120, in cooperation with two adjacent data samplers 114–115, operates as a phase detector 130. The data samplers 111–115 and edge detector 120 may be embodied, for example, as D-type flip flops. The edge detector 120 is clocked by a clock phase, $\phi_{45}$, which is between $\phi_4$ and $\phi_5$. Thus, the edge detector 120 only observes every fifth data edge. Preferably, the edge detector 120 is triggered by the inverse of $\phi_2$, as shown in FIGS. 1 and 2. In this manner, the phase detector 130 serves to align the VCO output, $V_O$, with the edge in between data bits $D_4$ and $D_5$. Thus, if there is a binary transition from high to low, for example, between data bits $D_4$ and $D_5$, the measurement of the edge detector 120 will also be either high or low, indicating whether the sampling is being done just before or just after the falling edge, respectively. Likewise, if there is a binary transition from low to high between data bits $D_4$ and $D_5$, the measurement of the edge detector 120 will be either low or high, indicating whether the sampling is being done just before or just after the rising edge, respectively.

Figure 3:
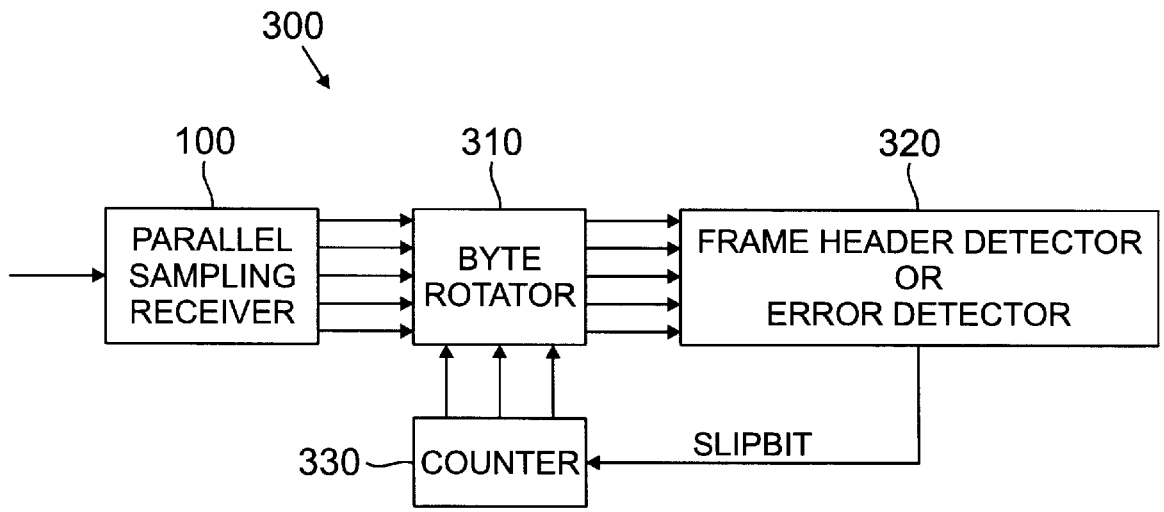
FIG. 3 illustrates a conventional receiver implementing byte alignment by means of error detection or frame header detection.

FIG. 3 illustrates a conventional receiver 300 that includes a parallel sampling receiver, such as the parallel sampling receiver 100, shown in FIG. 1. The receiver 300 implements byte alignment utilizing an error detector or a frame header detector 320. An error detection implementation typically encodes bytes, and then if frequent errors are detected at the receiver, assumes the data has been received properly, but that the data is not properly aligned. In a frame header detection implementation, the incoming data stream is monitored until a frame header is identified, thereby indicating byte placement. If a bit error is detected, or a frame header cannot be found, the SlipBit signal is activated to rotate and delay part of the received byte by the byte rotator 310. The error detector and frame header detector 320 can be significantly simplified if bytes are already aligned at their input.

Figure 4:
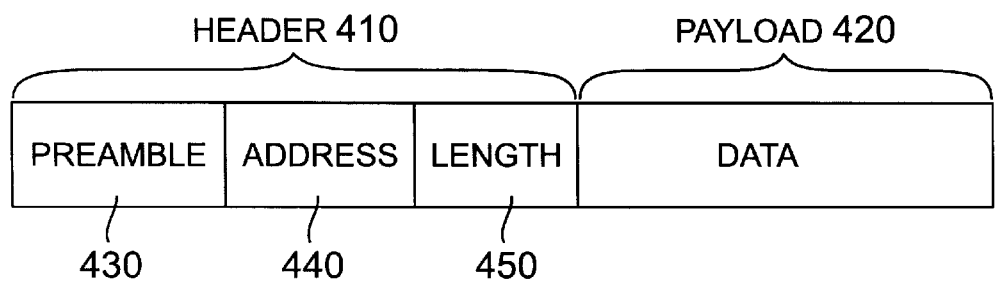
FIG. 4 provides an illustrative frame format definition.

According to a feature of the present invention, byte alignment is provided by the parallel sampling receiver 100, shown in FIG. 1, as modified herein to incorporate the features and functions of the present invention. FIG. 4 provides an illustrative frame format definition. As shown in FIG. 4, each frame can be of fixed or variable length, and is comprised of a header 410 and a payload 420. The header typically includes a preamble sequence 430, a destination address 440 and a length 450 (indicating the length of the frame).

By using a properly selected preamble sequence, the phase detector 130 can accomplish both bit and byte synchronization. A preamble sequence 430 consists of bytes, each containing only one positive edge. When the phase detector 130 receives the predefined preamble sequence, and locks the PLL to the preamble sequence 430, the phase detector 130 will automatically perform byte alignment. In one illustrative implementation, the phase detector 130 will automatically perform byte alignment if a preamble in the frame header consists, for example, of consecutive 11001 bytes (in the illustrative 5 bit implementation) and the phase detector 130 is made to lock onto a positive edge. It is noted that there is only one positive edge in the pattern "111001." Generally, the predefined preamble sequence should contain only one positive edge, positioned at the location of the edge detector 120. If a byte is defined to be ten symbols, every other preamble symbol can be 11111. It is noted that if the PLL circuit temporarily unlocks during runtime, the PLL cannot recover until a new predefined preamble sequence is received.

Figure 5:
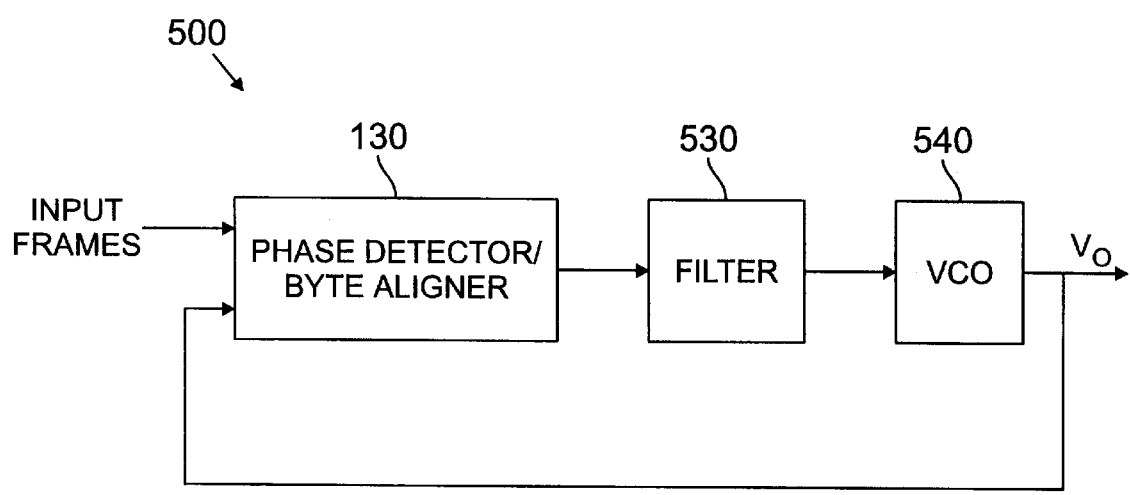
FIG. 5 illustrates a PLL circuit having a phase detector that performs bye alignment in accordance with the present invention.

FIG. 5 illustrates a PLL circuit 500 that includes a phase detector 130, a loop filter 530 and a voltage-controlled oscillator (VCO) 540. As discussed above in conjunction with FIG. 1, the phase detector 130 includes at least one data sampler, such as the data samplers 114, 115, for sampling two adjacent data bits of an incoming data signal. The phase detector 130 compares the incoming reference signal, Input Frames, and the output of the VCO, $V_O$. Specifically, the phase detector 130 includes an edge detector 120 for sampling the incoming data signal between the two adjacent data bits. The edge detector 120 generates an error signal representing the phase difference between the reference signal, Input Frames, and the VCO output, $V_O$. The error signal is filtered by the loop filter 530 and applied to the VCO 540 to produce an output signal, $V_O$, that tracks the phase of the reference signal, Input Frames. As previously indicated, the edge detector 130 monitors the incoming data stream for a predefined preamble sequence, discussed above in conjunction with FIG. 4, indicating byte alignment.

It is to be understood that the embodiments and variations shown and described herein are merely illustrative of the principles of this invention and that various modifications may be implemented by those skilled in the art without departing from the scope and spirit of the invention. For example, while the invention has been illustrated primarily in a parallel receiver embodiment, the invention applies to serial receivers as well, as would be apparent to a person of ordinary skill.

I claim:

1. A receiver, comprising:

at least one data sampler for sampling two adjacent data bits of an incoming data signal, an edge detector for sampling said incoming data signal between said two adjacent data bits and for generating an error signal corresponding to the difference in phase of said incoming data signal and an oscillator output, wherein said edge detector monitors said incoming data signal for a predefined preamble sequence indicating byte alignment;

a loop filter having an input and an output, the input being connected to said error signal, said loop filter producing a filtered error signal; and a governable oscillator having a control terminal and an output, the control terminal being connected to the filtered error signal and said governable oscillator producing the oscillator output, said oscillator output tracking the phase of the incoming data signal.

2. The receiver according to claim 1, wherein said governable oscillator is a voltage-controlled oscillator (VCO).

3. The receiver according to claim 1, wherein said loop filter is a low pass filter.

4. The receiver according to claim 1, wherein said edge detector is a D-type flip flop.

5. The receiver according to claim 1, wherein said predefined preamble sequence contains only one positive edge in each byte of said predefined preamble sequence.

6. The receiver according to claim 5, wherein said oscillator output has an edge that is aligned to said positive edge.

7. The receiver according to claim 1, wherein said predefined preamble sequence contains only one negative edge in each byte of said predefined preamble sequence.

8. The receiver according to claim 7, wherein said oscillator output has an edge that is aligned to said negative edge.

9. A method of aligning bytes in a receiver, said method comprising the steps of:

sampling two adjacent data bits of an incoming data signal, sampling said incoming data signal between said two adjacent data bits;

generating an error signal corresponding to the difference in phase of said incoming data signal and an oscillator output signal based on said sampling between said adjacent data bits;

monitoring said incoming data signal for a predefined preamble sequence indicating byte alignment;

filtering said error signal to produce a filtered error signal; and applying said filtered error signal to a governable oscillator to generate said oscillator output signal, said oscillator output signal tracking the phase of the incoming data signal.

10. The method according to claim 9, wherein said governable oscillator is a voltage-controlled oscillator (VCO).

11. The method according to claim 9, wherein said filtering step is performed by a low pass filter.

12. The method according to claim 9, wherein said two sampling steps are performed by a phase detector.

13. The method according to claim 12, wherein said phase detector includes D-type flip flops.

14. The method according to claim 9, wherein said predefined preamble sequence contains only one positive edge in each byte of said predefined preamble sequence.

15. The method according to claim 14, wherein said oscillator output signal has an edge that is aligned to said positive edge.

16. The method according to claim 9, wherein said predefined preamble sequence contains only one negative edge in each byte of said predefined preamble sequence.

17. The method according to claim 16, wherein said oscillator output signal has an edge that is aligned to said negative edge.

18. A phase-locked loop (PLL) circuit for aligning bytes in a receiver, comprising:
  a phase detector having a reference input, a feedback input and an output, the reference input being an input of said PLL, wherein an error signal is generated at said output corresponding to the phase difference of signals at said reference input and said feedback input, said reference input receiving an input signal including a plurality of bytes and a preamble sequence;
  a loop filter having an input and an output, the input being connected to the error signal generated by the phase detector, said loop filter producing a filtered error signal; and
  a governable oscillator having a control terminal and an output, the control terminal being connected to the filtered error signal and the governable oscillator producing an oscillator output connected to said feedback input of said phase detector, said oscillator output tracking the phase of the signal at said reference input, wherein said bytes are aligned when said preamble sequence is aligned to said oscillator output.

19. The phase-locked loop (PLL) circuit according to claim 18, wherein said preamble sequence contains only one positive edge in each byte of said preamble sequence.

20. The phase-locked loop (PLL) circuit according to claim 19, wherein said oscillator output has an edge that is aligned to said positive edge.

21. The phase-locked loop (PLL) circuit according to claim 18, wherein said preamble sequence contains only one negative edge in each byte of said preamble sequence.

22. The phase-locked loop (PLL) circuit according to claim 21, wherein said oscillator output has an edge that is aligned to said negative edge.

23. A method for generating an oscillator output signal in a receiver, said method comprising the steps of:
  comparing an input signal to said oscillator output signal, said input signal including a plurality of bytes and a preamble sequence;
  generating an error signal corresponding to a difference in phase of said input signal and said oscillator output signal;
  filtering said error signal; and
  generating said oscillator output signal to track the phase of the input signal, said bytes of said input signal being aligned with said oscillator output signal when said oscillator output signal tracks the phase of said preamble sequence.

24. The method according to claim 23, wherein said preamble sequence contains only one positive edge in each byte of said preamble sequence.

25. The method according to claim 24, wherein said oscillator output signal has an edge that is aligned to said positive edge.

26. The method according to claim 23, wherein said preamble sequence contains only one negative edge in each byte of said preamble sequence.

27. The method according to claim 26, wherein said oscillator output signal has an edge that is aligned to said negative edge.

28. A receiver comprising:
  means for sampling two adjacent data bits of an incoming data signal,
  means for sampling said incoming data signal between said two adjacent data bits;
  means for generating an error signal corresponding to a difference in phase of said incoming data signal and an oscillator output signal based on said sampling between said adjacent data bits;
  means for monitoring said incoming data signal for a predefined preamble sequence indicating byte alignment;
  means for filtering said error signal to produce a filtered error signal; and
  means for applying said filtered error signal to a governable oscillator to generate said oscillator output signal, said oscillator output signal tracking the phase of the incoming data signal.

29. The receiver according to claim 28, wherein said preamble sequence contains only one positive edge in each byte of said preamble sequence.

30. The receiver according to claim 29, wherein said oscillator output signal has an edge that is aligned to said positive edge.

31. The receiver according to claim 28, wherein said predefined preamble sequence contains only one negative edge in each byte of said predefined preamble sequence.

32. The receiver according to claim 31, wherein said oscillator output signal has an edge that is aligned to said negative edge.

33. A method of aligning bytes in a receiver that produces a local oscillator signal, said method comprising the steps of:
  sampling two adjacent data bits of an incoming data signal,
  sampling said incoming data signal between said two adjacent data bits; and
  generating an error signal corresponding to a difference in phase of said incoming data signal and said local oscillator signal based on said sampling between said adjacent data bits, said incoming data signal including a preamble sequence consisting of bytes containing only a single positive edge.

34. A receiver, comprising:
  at least one data sampler for sampling two adjacent data bits of an incoming data signal,
  an edge detector for sampling said incoming data signal between said two adjacent data bits and for generating an error signal corresponding to a difference in phase of said incoming data signal and an oscillator signal, wherein said edge detector monitors said incoming data signal for a predefined preamble sequence indicating byte alignment; and
  a governable oscillator that receives a version of the error signal and generates in response thereto said oscillator signal that tracks the phase of the incoming data signal.

35. The receiver according to claim 34, wherein said governable oscillator is a voltage-controlled oscillator (VCO).

36. The receiver according to claim 34, wherein said edge detector is a D-type flip flop.

37. The receiver according to claim 34, wherein said predefined preamble sequence contains only one positive edge in each byte of said predefined preamble sequence.

38. The receiver according to claim 37, wherein said oscillator output signal has an edge that is aligned to said positive edge.

39. The receiver according to claim 34, wherein said predefined preamble sequence contains only one negative edge in each byte of said predefined preamble sequence.

40. The receiver according to claim 39, wherein said oscillator signal has an edge that is aligned to said negative edge.

41. The receiver according to claim 34, wherein a version of the error signal supplied to the governable oscillator is a filtered version of the error signal.

42. The receiver according to claim 34, further comprising a filter for filtering the error signal which is supplied as a filtered version of the error signal to the governable oscillator.

* * * * *